(12) United States Patent
Mohammed et al.

(10) Patent No.: US 9,165,906 B2
(45) Date of Patent: Oct. 20, 2015

(54) HIGH PERFORMANCE PACKAGE ON PACKAGE

(71) Applicant: Invensas Corporation, San Jose, CA (US)

(72) Inventors: Ilyas Mohammed, Santa Clara, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 193 days.

(21) Appl. No.: 13/709,723

(22) Filed: Dec. 10, 2012

(65) Prior Publication Data

US 2014/0159248 A1    Jun. 12, 2014

(51) Int. Cl.
*H01L 23/48* (2006.01)
*H01L 23/52* (2006.01)
(Continued)

(52) U.S. Cl.
CPC ........ *H01L 25/0652* (2013.01); *H01L 25/0655* (2013.01); *H01L 25/105* (2013.01);
(Continued)

(58) Field of Classification Search
CPC ............... H01L 25/0657; H01L 2224/16145; H01L 2224/4824; H01L 2224/1308; H01L 2224/48145; H01L 25/50; H01L 23/49827; H01L 2225/06541; H01L 23/5389; H01L 2225/1035; H01L 23/49838; H01L 25/0652
USPC .......... 257/774, 777, 773, E21.499, E23.011, 257/E23.068, E23.141, 4, 778, 698, 734, 257/E23.174, 686, E25.018, E25.013, 692, 257/E21.602, E23.079, E23.169, E23.172, 257/E25.001, E25.011, E25.029, 678, 687, 257/693, 787; 438/107, 109, 124, 127, 108, 438/15, 106, 667, 675, 51
See application file for complete search history.

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |

(Continued)

FOREIGN PATENT DOCUMENTS

| | | |
|---|---|---|
| TW | 201131731 A | 9/2011 |
| WO | 2009042463 A1 | 4/2009 |
| WO | 2010057808 A1 | 5/2010 |

OTHER PUBLICATIONS

International Search Report and Written Opinion for Application No. PCT/US2013/074079 dated May 14, 2014.
(Continued)

*Primary Examiner* — Daniel Shook
*Assistant Examiner* — Cory Eskridge
(74) *Attorney, Agent, or Firm* — Lerner, David, Littenberg, Krumholz & Mentlik, LLP (57) ABSTRACT

A microelectronic assembly can include a first package comprising a processor and a second package electrically connected to the first package. The second package can include two or more microelectronic elements each having memory storage array function and contacts at a respective element face, upper and lower opposite package faces, upper and lower terminals at the respective upper and lower package faces, and electrically conductive structure extending through the second package. At least portions of edges of respective microelectronic elements of the two or more microelectronic elements can be spaced apart from one another, so as to define a central region between the edges that does not overlie any of the element faces of the microelectronic elements of the second package. The electrically conductive structure can be aligned with the central region and can electrically connect the lower terminals with at least one of: the upper terminals or the contacts.

29 Claims, 6 Drawing Sheets (51) Int. Cl.
*H01L 25/065* (2006.01)
*H01L 25/10* (2006.01)
*H01L 25/18* (2006.01)
*H01L 23/31* (2006.01)
*H01L 23/538* (2006.01)
*H01L 23/13* (2006.01)

(52) U.S. Cl.
CPC ............... *H01L 25/18* (2013.01); *H01L 23/13* (2013.01); *H01L 23/3128* (2013.01); *H01L 23/5389* (2013.01); *H01L 2224/16225* (2013.01); *H01L 2224/32145* (2013.01); *H01L 2224/32225* (2013.01); *H01L 2224/4824* (2013.01); *H01L 2224/73215* (2013.01); *H01L 2225/0651* (2013.01); *H01L 2225/06562* (2013.01); *H01L 2225/1023* (2013.01); *H01L 2225/1035* (2013.01); *H01L 2225/1058* (2013.01); *H01L 2924/15311* (2013.01)

(56) References Cited

U.S. PATENT DOCUMENTS

| | | | |
|---|---|---|---|
| 5,679,977 | A | 10/1997 | Khandros et al. |
| 6,177,636 | B1 | 1/2001 | Fjelstad |
| 6,665,194 | B1 * | 12/2003 | Patel et al. ............... 361/767 |
| 2007/0278642 | A1 * | 12/2007 | Yamaguchi et al. ...... 257/686 |
| 2009/0184412 | A1 * | 7/2009 | Yasunaga ................ 257/693 |
| 2009/0236726 | A1 | 9/2009 | Retuta et al. |
| 2009/0243064 | A1 * | 10/2009 | Camacho et al. ......... 257/680 |
| 2010/0133682 | A1 * | 6/2010 | Meyer ..................... 257/698 |
| 2011/0291283 | A1 | 12/2011 | Chi et al. |
| 2012/0217642 | A1 * | 8/2012 | Sun et al. ................. 257/773 |
| 2012/0313239 | A1 | 12/2012 | Zohni |
| 2012/0313253 | A1 | 12/2012 | Nakadaira et al. |
| 2013/0009308 | A1 * | 1/2013 | Kwon ...................... 257/738 |

OTHER PUBLICATIONS

Copending U.S. Appl. No. 61/506,889, filed Jul. 12, 2011.
Taiwanese Office Action for Application No. 102145262 dated May 25, 2015.

* cited by examiner

HIGH PERFORMANCE PACKAGE ON PACKAGE

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals that overlie the substrate. The "flip chip" design provides a relatively compact arrangement; each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding. Packages that can accommodate a single chip in an area of the circuit panel equal to or slightly larger than the area of the chip itself are commonly referred to as "chip-scale packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single-chip or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

The transmission of signals within packages to chips of multi-chip packages poses particular challenges, especially for signals common to two or more chips in the package such as clock signals, and address and strobe signals for memory chips. Within such multi-chip packages, the lengths of the connection paths between the terminals of the package and the chips can vary. The different path lengths can cause the signals to take longer or shorter times to travel between the terminals and each chip. Travel time of a signal from one point to another is called "propagation delay" and is a function of the conductor length, the conductor's structure, and other dielectric or conductive structure in close proximity therewith.

Differences in the times at which two different signals reach a particular location can also be called "skew". The skew in the arrival times of a particular signal at two or more locations is a result of both propagation delay and the times at which the particular signal starts to travel towards the locations. Skew may or may not impact circuit performance. Skew often has little impact on performance when all signals in a synchronous group of signals are skewed together, in which case all signals needed for operation arrive together when needed. However, this is not the case when different signals of a group of synchronous signals needed for operation arrive at different times. In this case the skew impacts performance because the operation cannot be performed unless all needed signals have arrived. The embodiments described herein can include features that minimize skew that are disclosed in the copending U.S. Provisional Patent Application No. 61/506,889 (TESSERA 3.8-664), the disclosure of which is incorporated by reference herein.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

In light of the foregoing, certain improvements can be made to multi-chip microelectronic packages and assemblies in order to improve electrical performance. These attributes of the present invention can be achieved by the construction of the microelectronic packages and assemblies as described hereinafter.

BRIEF SUMMARY OF THE INVENTION

In accordance with an aspect of the invention, a microelectronic assembly can include a first package comprising a microelectronic element embodying a processor and a second package electrically connected to the first package. The first package can have processor package terminals at a face thereof. The second package can include two or more microelectronic elements each having memory storage array function, each having an element face and a plurality of contacts at the respective element face. The second package can also include upper and lower opposite package faces each parallel to the element faces, the upper package face defined by a surface of a dielectric layer overlying the element faces of the two or more microelectronic elements. At least portions of edges of respective microelectronic elements of the two or more microelectronic elements can be spaced apart from one another, so as to define a central region between the edges that does not overlie any of the element faces of the microelectronic elements of the second package.

The second package can also include upper terminals at the upper package face and lower terminals at the lower package face and configured for electrically connecting the assembly with a component external thereto. The upper terminals can be joined to the processor package terminals and can be electrically connected with at least some of the contacts. The second package can also include electrically conductive structure aligned with the central region and extending through the second package to electrically connect the lower terminals with at least one of: the upper terminals or the contacts.

In one embodiment, the microelectronic assembly can also include peripheral conductive interconnects aligned with a peripheral region defined between the central region and outer edges of the second package and not overlying any of the element faces of the microelectronic elements of the second package. The peripheral conductive interconnects can connect the lower terminals with at least one of: the upper terminals or the contacts. In a particular example, at least a portion of the electrically conductive structure aligned with the central region can be configured to carry at least one of power or ground to the upper terminals. In an exemplary embodiment, at least a portion of the electrically conductive structure aligned with the central region can be configured to carry at least one of power or ground to the contacts of the microelectronic elements of the second package. In one example, at least some of the peripheral conductive interconnects can be configured to carry data signals to the upper terminals.

In a particular embodiment, the upper terminals and the lower terminals can each include central terminals at the central region and peripheral terminals at the peripheral region. The upper terminals can include intermediate terminals overlying the element face of at least one of the microelectronic elements of the second package. In one embodiment, at least some of the upper terminals can overlie the element face of at least one of the microelectronic elements of the second package. In a particular example, the at least some of the upper terminals can be electrically connected to the contacts of at least one of the microelectronic elements of the second package, and the processor package terminals connected to the at least some of the upper terminals can be electrically connected to contacts of the microelectronic element of the first package.

In an exemplary embodiment, the at least some of the upper terminals can be configured to carry at least one of: data signals or address information usable by circuitry within the second package to determine an addressable memory location from among all the available addressable memory locations of a memory storage array of at least one of the microelectronic elements of the second package. In one example, at least some of the upper and lower terminals can be electrically connected within the second package to the contacts of the microelectronic elements of the second package. In a particular embodiment, the microelectronic element of the first package can be electrically connected to a first one of the microelectronic elements of the second package, and the first one of the microelectronic elements of the second package can be electrically connected to a second one of the microelectronic elements of the second package.

In one embodiment, a first portion of the electrically conductive structure aligned with the central region can be electrically connected within the second package to the contacts of the microelectronic elements of the second package, and a second portion of the electrically conductive structure aligned with the central region can be electrically insulated within the second package from the microelectronic elements of the second package. In a particular example, at least a portion of the electrically conductive structure aligned with the central region can be electrically insulated within the second package from the microelectronic elements of the second package. In an exemplary embodiment, at least some of the peripheral conductive interconnects can be electrically insulated within the second package from the microelectronic elements of the second package.

In a particular example, the conductive structure can include a bond via array of wire bonds bonded to conductive elements at the surface of the dielectric layer. In an exemplary embodiment, the central region can extend within a middle third of the distance between first and second opposed lateral edges of the second package, the lateral edges extending away from the upper package face of the second package.

In one example, the microelectronic assembly can also include a heat spreader in thermal communication with the microelectronic element of the first package. In a particular example, the heat spreader can at least partially overlie a rear face of the microelectronic element of the first package remote from the surface of the first package. In a particular embodiment, the first package can include at least one passive element electrically connected to the microelectronic element of the first package, the at least one passive element disposed adjacent a peripheral edge of the microelectronic element of the first package. In one embodiment, the at least one passive element can include at least one decoupling capacitor.

In one embodiment, the microelectronic elements of the second package together can embody a greater number of active devices to provide memory storage array function than any other function. In an exemplary embodiment, each of the element faces of the microelectronic elements can be disposed in a single plane parallel to the upper package face of the second package. In a particular example, the second package can include a substrate, and the surface of the dielectric layer that defines the upper package face of the second package can be a first surface of the substrate.

In an exemplary embodiment, the dielectric layer can be formed on surfaces of the microelectronic elements, and the second package can include traces formed on the dielectric layer and connected with the upper and lower terminals. In one example, the contacts of one or more of the microelectronic elements can face and can be electrically connected to substrate contacts at a second surface of the substrate opposite from the first surface thereof. In a particular embodiment, the substrate can have at least one aperture extending through a thickness thereof, and the contacts of one or more of the microelectronic elements can be aligned with the at least one aperture and can be electrically connected with substrate contacts at the first surface of the substrate by a plurality of leads. In one embodiment, at least some of the leads can include wire bonds extending through the at least one aperture.

In a particular example, the two or more microelectronic elements can include first, second, third, and fourth microelectronic elements, and the microelectronic elements can have first, second, third, and fourth axes extending along the inner edge of the respective first, second, third, and fourth microelectronic elements, the axes together defining a closed outer boundary of the central region. In an exemplary embodiment, the first and third axes can be parallel to one another, and the second and fourth axes can be transverse to the first and third axes. In one example, the second and fourth axes can be orthogonal to the first and third axes. In a particular embodiment, the two or more microelectronic elements can include first, second, third, and fourth microelectronic elements, and the contacts of each of the microelectronic elements can be arranged along respective first, second, third, and fourth parallel axes.

In one embodiment, the second package can be joined with the component, the component comprising a circuit panel having a panel face and a plurality of panel contacts at the panel face, and at least some of the lower terminals can be joined to the panel contacts. In a particular example, the panel contacts can be electrically connected with the microelectronic element of the first package through the electrically conductive structure aligned with the central region of the second package.

In an exemplary embodiment, the microelectronic assembly can also include peripheral conductive interconnects aligned with a peripheral region defined between the central region and outer edges of the second package and not overlying any of the element faces of the microelectronic elements of the second package. The peripheral conductive interconnects can connect the lower terminals with at least one of: the upper terminals or the contacts. The panel contacts can be electrically connected with the processor package terminals through at least a portion of the electrically conductive structure aligned with the central region and at least some of the peripheral conductive interconnects. In one example, a system can include a microelectronic assembly as described above and one or more other electronic components electrically connected to the microelectronic assembly. In one embodiment, the system can also include a housing, said microelectronic assembly and said other electronic components being mounted to said housing.

DETAILED DESCRIPTION

Embodiments of the invention herein provide packages that have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multichip packages can be particularly useful for making large amounts of relatively inexpensive memory available to a system, such as advanced high performance dynamic random access memory ("DRAM") chips, e.g., in DDR3 type DRAM chips and its follow-ons.

Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Figure 1A:
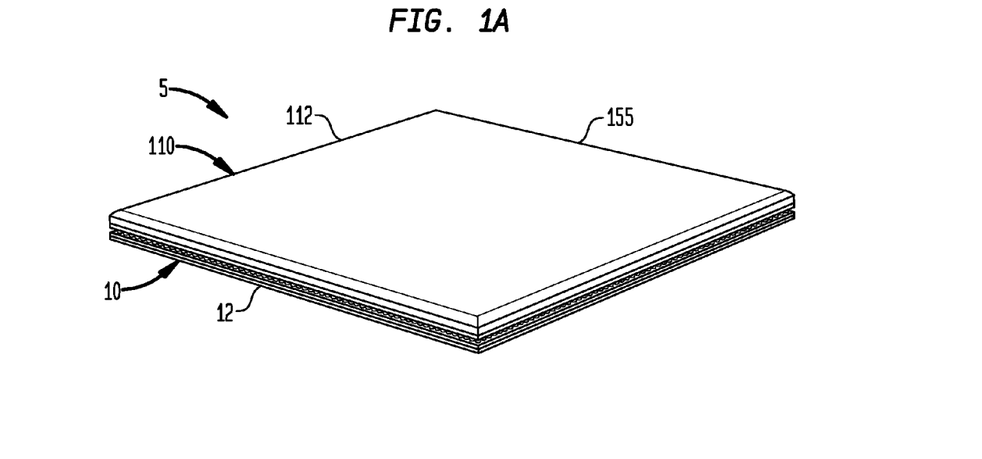
FIG. 1A is a diagrammatic perspective view of a microelectronic assembly according to an embodiment of the present invention.
Figure 1B:
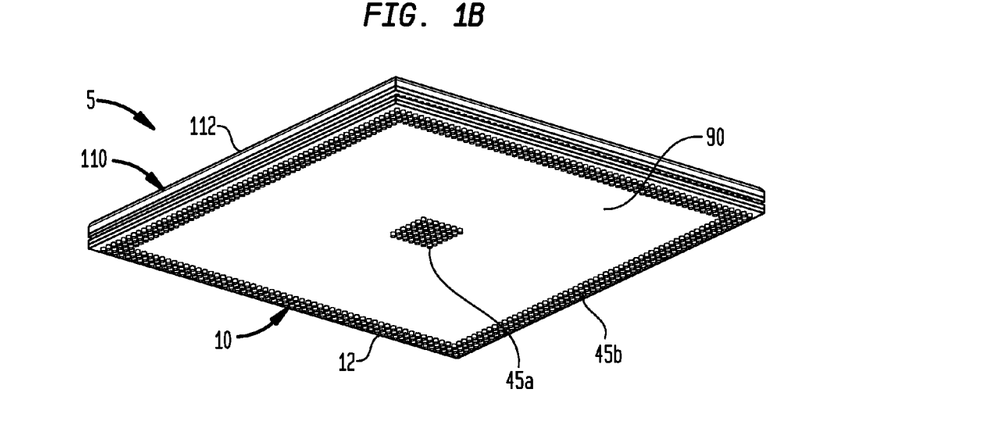
FIG. 1B is a bottom perspective view of the microelectronic assembly of FIG. 1A.
Figure 1C:
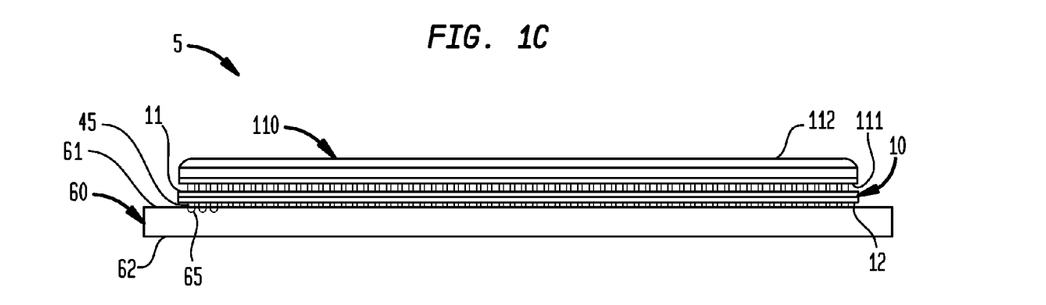
FIG. 1C is a side view of the microelectronic assembly of FIG. 1A, shown mounted to a circuit panel.

FIGS. 1A-1C illustrate a particular type of microelectronic assembly 5 according to an embodiment of the invention. As seen in FIGS. 1A-1C, the microelectronic assembly 5 can include a first package 110, a second package 10, and a circuit panel 60. The first package 110 and the second package 10 can be joined together, and the second package can be joined to the circuit panel 60.

Figure 2A:
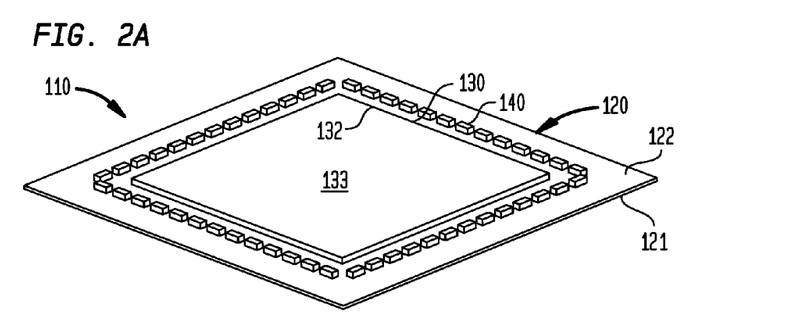
FIG. 2A is a top perspective view of the first package of FIG. 1A, shown without the heat spreader or the encapsulant.
Figures 2B, 2C:
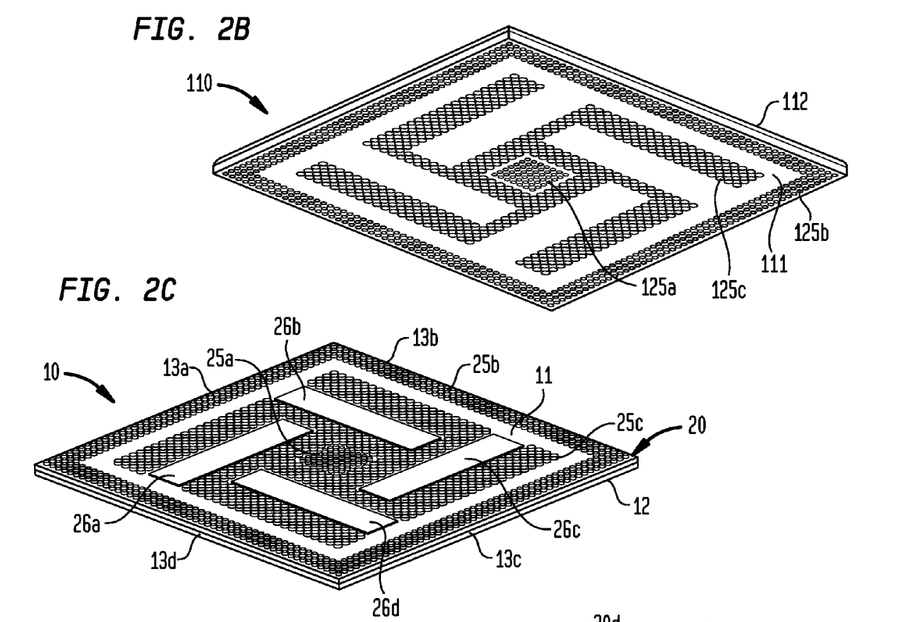
FIG. 2B is a bottom perspective view of the first package of FIG. 1A.
FIG. 2C is a top perspective view of the second package of FIG. 1A.

Referring to FIGS. 2A and 2B, the first package 110 can have first and second opposed package faces 111, 112. The first package 110 can include a microelectronic element 130 assembled with a substrate 120 having opposed first and second surfaces 121, 122. In one example, electrically conductive element contacts at a surface of the microelectronic element 130 can face and be joined to electrically conductive substrate contacts at the second surface 122, for example, with flip-chip connections.

As used in this disclosure with reference to a substrate, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

The microelectronic element 130 can be configured to predominantly provide logic function. The first package 110 can include at least one passive element 140 mounted to the second surface 122 of the substrate 120. The at least one passive element 140 can be disposed adjacent a peripheral edge 132 of the microelectronic element 130. As shown in FIG. 2A, the first package 110 can have a plurality of spaced apart passive elements 140 extending along the peripheral edges 132 of the microelectronic element 130. In one example, the at least one passive element 140 can include at least one decoupling capacitor. Such decoupling capacitors can be electrically connected to internal power and ground buses inside the first package 110.

As can be seen in FIG. 1A, the first package 110 can also include a heat spreader assembly 155. The heat spreader assembly 155 can include a heat spreader in thermal communication with the microelectronic element 130, and an encapsulant covering one or more exposed surface of the heat spreader. The heat spreader may be coupled to a surface of the microelectronic element 130 by a thermally conductive adhesive or grease, for example. In one example, the heat spreader can at least partially overlie a rear face 133 of the microelectronic element 130 of the first package remote from the first package face 111 of the first package.

The heat spreader in the heat spreader assembly 155 can be partly or entirely made of any suitable thermally conductive material. Examples of suitable thermally conductive material include, but are not limited to, metal, graphite, thermally conductive adhesives, e.g., thermally-conductive epoxy, a solder, or the like, or a combination of such materials. In one example, the heat spreader can be a substantially continuous sheet of metal.

In one embodiment, the heat spreader can include a metallic layer disposed adjacent to the microelectronic element 130. The metallic layer may be exposed the second package face of the first package 110. Alternatively, the heat spreader can include an overmold or an encapsulant covering at least a rear surface of the microelectronic element 130. In one example, the heat spreader can be in thermal communication with at least one of the front surface and rear surface of the microelectronic element 130. The heat spreader can improve heat dissipation to the surrounding environment.

In a particular embodiment, a pre-formed heat spreader made of metal or other thermally conductive material may be attached to or disposed on a rear surface of the microelectronic element 130 with a thermally conductive material such as thermally conductive adhesive or thermally conductive grease. The adhesive, if present, can be a compliant material that permits relative movement between the heat spreader and the microelectronic element 130 to which it is attached, for example, to accommodate differential thermal expansion between the compliantly attached elements. The heat spreader may be a monolithic structure. Alternatively, the heat spreader may include multiple spreader portions spaced apart from one another. In a particular embodiment, the heat spreader may be or include a layer of solder joined directly to at least a portion of the rear surface of the microelectronic element 130.

The first package 110 can have processor package terminals 125, at the first package face 111 of the first package, e.g., conductive pads, lands, or conductive posts or pins thereon. The processor package terminals 125 can include central terminals 125a, peripheral terminals 125b, and intermediate terminals 125c configured to be joined to corresponding terminals at a surface of the second package 10.

In an exemplary embodiment, the processor package terminals 125 (and any of the other terminals described herein) can include substantially rigid posts made from an electrically conductive material such as copper, copper alloy, gold, nickel, and the like. The terminals 125 can be formed, for example, by plating an electrically conductive material into openings in a resist mask, or by forming posts made, for example, of copper, copper alloy, nickel, or combinations thereof. Such posts can be formed, for example, by subtractively patterning a metal sheet or other metal structure into posts that extend away from the substrate 120 as terminals for electrically interconnecting the first package 110 with the second package 10, for example. The terminals 125 can be substantially rigid posts having other configurations, as described for example in U.S. Pat. No. 6,177,636, the disclosure of which is hereby incorporated herein by reference. In one example, the terminals 125 can have exposed contact surfaces that are coplanar with one another.

Figure 2D:
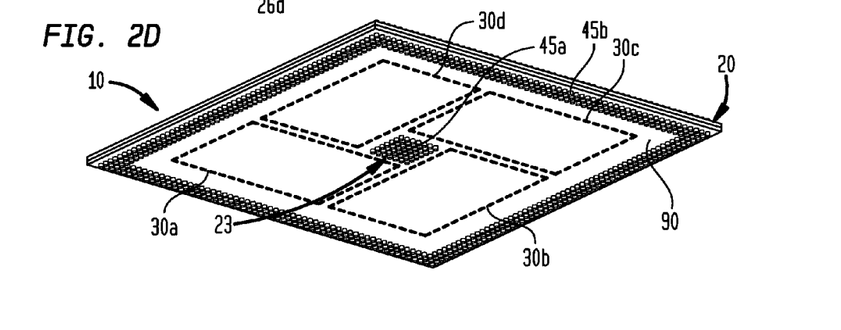
FIG. 2D is a bottom perspective view of the second package of FIG. 1A, showing the location of the microelectronic elements.
Figure 3A:
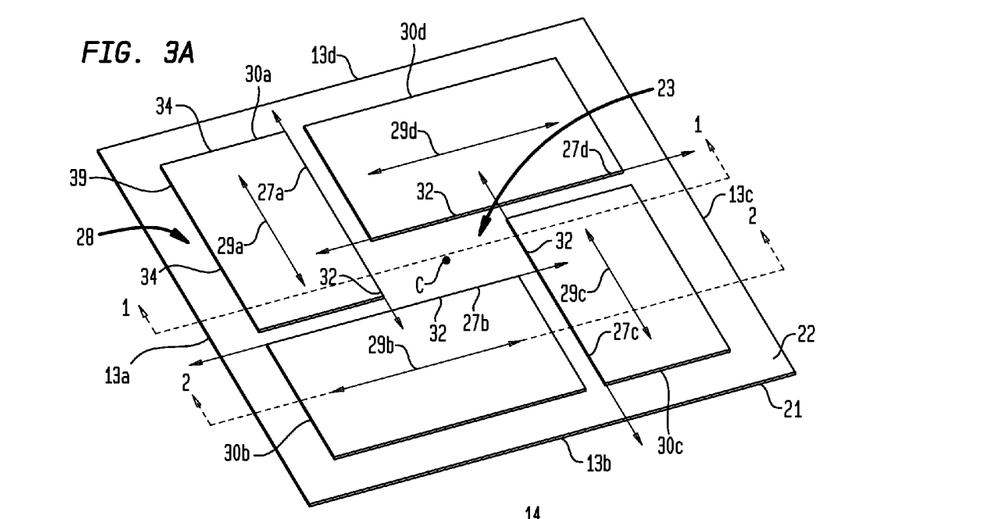
FIG. 3A is a bottom perspective view of the second package of FIG. 1A, shown without the encapsulant.

Referring to FIGS. 2C and 2D, the second package 10 can have a first or upper package face 11 and a second or lower package face 12. As shown in FIG. 3A, the second package 10 can include a plurality of microelectronic elements 30 assembled with a substrate 20 having opposed first and second surfaces 21, 22. As shown in FIG. 3A, the second package 10 can have four microelectronic elements 30a, 30b, 30c, and 30d mounted to the second surface 22 of the substrate. In other embodiments (e.g., as shown in FIGS. 4J-4L), the second package 10 may include other numbers of microelectronic elements 30, such as two or three microelectronic elements.

Figure 3B:
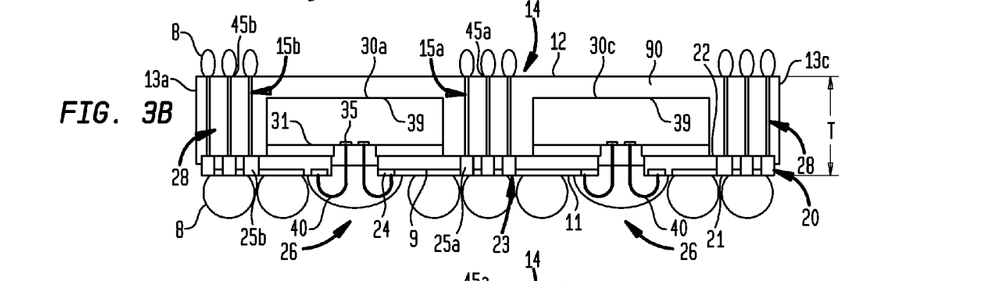
FIG. 3B is a side sectional view of one variation of the second package of FIG. 3A, taken along the line 1-1 of FIG. 3A.

As can be seen in FIG. 3B for example, each microelectronic element 30 can have an element face 31 and a plurality of element contacts 35 at the element face. The contacts 35 of each microelectronic element 30 can be arranged in one or more columns disposed in a central region of the front surface 31 that occupies a central portion of an area of the front surface. The central region, for example, may occupy an area of the front surface 31 that includes a middle third of the shortest distance between opposed edges of the microelectronic element 30.

In a particular embodiment, the second package 10 can have four microelectronic elements 30, the contacts 35 of each microelectronic element including eight data I/O contacts. In another embodiment, the second package 10 can have four microelectronic elements 30, the contacts 35 of each microelectronic element including sixteen data I/O contacts. In a particular example, the second package 10 (and any of the other microelectronic packages described herein) can be configured to transfer, i.e., receive by the package, or transmit from the package thirty-two data bits in parallel in a clock cycle. In another example, the second package 10 (and any of the other microelectronic packages described herein) can be configured to transfer sixty-four data bits in parallel in a clock cycle. A number of other data transfer quantities are possible, among which only a few such transfer quantities will be mentioned without limitation. For example, the second package 10 (and any of the other microelectronic packages described herein) can be configured to transfer seventy-two data bits per clock cycle that can include a set of sixty-four underlying bits that represent data and eight bits that are error correction code ("ECC") bits for the sixty-four underlying bits. Ninety-six data bits, 108 bits (data and ECC bits), 128 data bits, and 144 bits (data and ECC bits) are other examples of data transfer widths per cycle that the second package 10 (and any of the other second microelectronic packages described herein) can be configured to support.

Each of the element faces 31 of the microelectronic elements 30 can be disposed in a single plane parallel to the first package face 11 of the second package 10. FIG. 3A illustrates a particular arrangement of microelectronic elements 30a, 30b, 30c, and 30d on a substrate 20 similar to the shape of a pinwheel. In this case, at least some of the plurality of element contacts 35 of each microelectronic element 30 can be arranged in a respective column of contacts defining respective first, second, third, and fourth axis 29a, 29b, 29c, and 29d (collectively axes 29).

In the example shown in FIG. 3A, the first and third axes 29a and 29c can be parallel to one another, the second and fourth axes 29b and 29d can be parallel to one another, and the first and third axes can be transverse to the second and fourth axes. In a particular embodiment, the first and third axes 29a and 29c can be orthogonal to the second and fourth axes 29b and 29d. Many other arrangements of the microelectronic elements of the second package are contemplated by the invention, as will be described below with reference to FIGS. 4A through 5C.

In the particular example shown in FIG. 3A, the axis 29 of each microelectronic element 30 can bisect the respective microelectronic element and can intersect the area of exactly one other microelectronic element in the microelectronic package 10. For example, the first axis 29a can bisect the first microelectronic element 30a and can intersect the area of exactly one other microelectronic element 30. Similarly, the second axis 29b can bisect the second microelectronic element 30b and can intersect the area of exactly one other microelectronic element 30. The same is also true of the third axis 29c which can bisect the third microelectronic element 30c and can intersect the area of exactly one other microelectronic element 30. Indeed, this is also true of the fourth axis 29d that can bisect the fourth microelectronic element 30d and can intersect the area of exactly one other microelectronic element 30.

Each of the microelectronic elements 30 can be configured to predominantly provide a memory storage array function. In such microelectronic element 30, the number of active devices, e.g., transistors, therein that are configured, i.e., constructed and interconnected with other devices, to provide memory storage array function, can be greater than the number of active devices that are configured to provide any other function. Thus, in one example, a microelectronic element 30 such as a DRAM chip may have memory storage array function as its primary or sole function.

Alternatively, in another example, such microelectronic element 30 may have mixed use and may incorporate active devices configured to provide memory storage array function, and may also incorporate other active devices configured to provide another function such as processor function, or signal processor or graphics processor function, among others. In this case, the microelectronic element 30 may still have a greater number of active devices configured to provide the memory storage array function than any other function of the microelectronic element. In a particular example, the microelectronic elements 30 of the second package 10 can together embody a greater number of active devices to provide memory storage array function than any other function.

In one example, each of the microelectronic elements 30 can be bare chips or microelectronic units each incorporating a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface.

In a particular example, a microelectronic element 30 that includes a memory storage element can have at least a memory storage array function, but the microelectronic element may not be a full-function memory chip. Such a microelectronic element may not have a buffering function itself, but it may be electrically connected to other microelectronic elements in a stack of microelectronic elements, wherein at least one microelectronic element in the stack has a buffering function (the buffering microelectronic element could be a buffer chip, a full-function memory chip, or a controller chip).

In other examples, one or more of the microelectronic elements in any of the packages described herein can embody a greater number of active devices to provide memory storage array function than any other function, e.g., as flash memory, DRAM or other type of memory, and can be arranged in a package together with another microelectronic element or "logic chip" that is configured to predominantly provide logic function. In a particular embodiment, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

In another variation, a microelectronic element in any of the packages described herein can have both logic and memory function embedded therein, such as a programmable processor having one or more associated memory storage arrays embedded therewith in the same microelectronic element. Such microelectronic element is sometimes referred to as a "system-on-a-chip" ("SOC"), in that logic such as a processor is embedded together with other circuitry such as a memory storage array or circuitry for performing some other function that may be a specialized function.

In a particular example, each of the microelectronic elements 30 can be functionally and mechanically equivalent to the other ones of the microelectronic elements, such that each microelectronic element can have the same pattern of electrically conductive contacts 35 at the front surface 31 with the same function, although the particular dimensions of the length, width, and height of each microelectronic element can be different than that of the other microelectronic elements.

The second package 10 can have package structure defining the first and second package faces 11, 12. The element face 31 of each of the microelectronic elements 30 can be oriented parallel to the first package face 11. The first package face 11 can be defined by a surface of a dielectric layer overlying the element faces 31 of the microelectronic elements 30. As shown in FIG. 3B for example, the first package face 11 can be the first surface 21 of the substrate 20. In other embodiments, the first package face 11 can be a surface of an encapsulant overlying the element faces 31 of the microelectronic elements 30, or a surface of an encapsulant overlying a lead frame.

In some cases, the substrate 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the substrate, i.e., in a direction along its surface.

The directions parallel to the first surface 21 of the substrate 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

At least portions of spaced apart inner edges 32 of respective ones of the microelectronic elements 30 can define a central region 23 of the substrate 20 (or of an alternative dielectric layer overlying the element faces of the microelectronic elements). In one example, the central region 23 may not overlie any of the element faces 31 of the microelectronic elements 30. The inner edges 32 that define the central region 23 can face toward a centroid C (FIG. 3A) of the second package 10. In a particular embodiment, the central region 23 of the substrate can extend within a middle third of the distance between first and second opposed lateral edges 13a, 13c (FIG. 3B) of the second package 10, the lateral edges extending normal to the first package face 11.

The microelectronic elements 30 and the outer edges 13a, 13b, 13c, 13d (FIG. 3A) of the second package 10 can define a peripheral region 28 of the substrate 20. In one example, the peripheral region 28 may not overlie any of the element faces 31 of the microelectronic elements 30. The peripheral region 28 can be bounded by one or more outer edges 34 of each of the microelectronic elements, the outer edges including a first outer edge opposite the inner edge and second and third outer edges extending between the inner edge and the first outer edge.

In one example, the central region 23 can have a closed outer boundary defined by axes 27 extending along the inner edge 32 of the respective microelectronic elements 30. For example, the microelectronic elements 30a, 30b, 30c, and 30d can have respective axes 27a, 27b, 27c, and 27d, each axis 27 extending along the inner edge 32 of the respective microelectronic element. The axes 27a, 27b, 27c, and 27d can together define a closed outer boundary of the central region 23.

Referring to FIG. 2C, the second package 10 can have upper terminals 25 at the first or upper package face 11 of the second package. The upper terminals 25 can include central terminals 25a, peripheral terminals 25b, and intermediate terminals 25c configured to be joined to corresponding terminals at the first package face 111 of the first package 110. The upper terminals 25 can be electrically connected with at least some of the element contacts 35 of the microelectronic elements 30. In the examples shown in the figures, the central terminals 25a and the peripheral terminals 25b do not overlie any of the microelectronic elements 30, but the intermediate terminals 25c can overlie the microelectronic elements.

As can be seen in FIG. 1C, the upper terminals 25 of the second package 10 can be joined to corresponding ones of the processor package terminals 125 of the first package 110. In a particular example, the central terminals 25a of the second package 10 can be joined to corresponding ones of the central terminals 125a of the first package 110, the peripheral terminals 25b of the second package 10 can be joined to corresponding ones of the peripheral terminals 125b of the first package 110, and the intermediate terminals 25c of the second package 10 can be joined to corresponding ones of the intermediate terminals 125c of the first package 110.

The second package 10 can have lower terminals 45 at the second or lower package face 12 of the second package. The lower terminals 45 can include central terminals 45a and peripheral terminals 45b. In one example, at least some of the upper and lower terminals 25, 45 can be connected to the contacts 35 of the microelectronic elements 30. The lower terminals 45 can be electrically connected with at least some of the element contacts 35 of the microelectronic elements 30. The examples shown in the figures do not show intermediate lower terminals, but in some embodiments, the lower terminals 45 can also include intermediate terminals that can overlie the microelectronic elements 30.

The lower terminals 45 can be configured to be joined to an external component, for example, corresponding panel contacts 65 at the first face 61 of the circuit panel 60 (FIG. 1C). The terminals 45 can function as endpoints for the connection of the second package 10 with corresponding electrically conductive elements of an external component such as the circuit panel 60, e.g., printed wiring board, flexible circuit panel, socket, other microelectronic assembly or package, interposer, or passive component assembly, among others. In one example, such a circuit panel can be a motherboard or DIMM module board. In a particular embodiment, the terminals can be arranged in an area array such as a ball-grid array (BGA) (including joining elements 11 as described below), a land-grid array (LGA), or a pin-grid array (PGA), among others.

Referring now to FIG. 3B, the lower terminals 45 can be connected with at least one of: the upper terminals 25; or the element contacts 35 through electrically conductive structure 14 aligned with the central region 23 and extending between the inner edges 32 of the microelectronic elements 30. In one example, the upper and lower terminals 25, 45 can be connected to one another by electrically conductive interconnects 15 extending in a direction of a thickness T of the second package 10. In one example, the conductive interconnects 15 can be disposed in a bond via array configuration.

The electrically conductive structure 14 can include a first set of interconnects 15a extending through the central region 23. The electrically conductive structure 14 can include a second set of interconnects 15b extending through the peripheral region 28. At least some of the first set of the conductive interconnects 15a can be electrically insulated from the microelectronic elements 30 within the second package 10, such that they can be pass-through electrical connections between the circuit panel 60 and the first package 110. At least some of the second set of the conductive interconnects 15b can be electrically insulated from the microelectronic elements 30 within the second package 10, such that they can be pass-through electrical connections between the circuit panel 60 and the first package 110.

In a particular example, at least some of the first set of the conductive interconnects 15a can be configured to carry at least one of power and reference potential signals. In one embodiment, at least some of the second set of the conductive interconnects 15b can be configured to carry input/output data signals and/or address information usable by circuitry within the second package to determine an addressable memory location from among all the available addressable memory locations of a memory storage array of at least one of the microelectronic elements 30 of the second package 10.

In an example where the substrate 20 is replaced by a dielectric layer formed on the front faces 31 of the microelectronic elements 30, the electrically conductive structure can include: traces formed on the dielectric layer and connected with the upper and lower terminals 25 and 45; and electrical connections including electrically conductive interconnects 15 extending through the dielectric layer to the element contacts 35.

The microelectronic package 10 can include joining elements 8 attached to the second and/or lower terminals 25, 45 for connection with an external component, such as the first package 110 or the circuit panel 60. The joining elements 8 can be, for example, masses of a bond metal such as solder, tin, indium, a eutectic composition or combination thereof, or another joining material such as a conductive paste or a conductive adhesive. In a particular embodiment, the joints between the package terminals and contacts of an external component (e.g., the circuit panel 60) can include an electrically conductive matrix material such as described in commonly owned U.S. patent application Ser. Nos. 13/155,719 and 13/158,797, the disclosures of which are hereby incorporated by reference herein. In a particular embodiment, the joints can have a similar structure or be formed in a manner as described therein.

As can be seen in FIG. 3B, for example, the substrate 20 can have at least one aperture 26 extending through the thickness T thereof. The element contacts 35 of one or more of the microelectronic elements can be aligned with the at least one aperture 25 and can be electrically connected with substrate contacts 24 at the first surface 21 of the substrate 20 by a plurality of leads, e.g., including wire bonds 40. As can be seen in FIG. 2C, the substrate 20 can have four apertures 26a, 26b, 26c, and 26d extending therethrough. In one example, each of the first, second, third and fourth axes 29a, 29b, 29c, and 29d, can be defined by a length of a corresponding one of the apertures 26a, 26b, 26c, and 26d, so that the apertures 26 can be arranged in a pinwheel configuration as described above.

Electrical connections between the contacts 35 and the terminals 25 can include optional leads, e.g., wire bonds 40, or other possible structure in which at least portions of the leads are aligned with at least one of the apertures 26. For example, as seen in FIG. 3B, at least some of the electrical connections can include a wire bond 40 that extends beyond an edge of an aperture 26 in the substrate 20, and is joined to the contact 35 and a conductive element 24 of the substrate. In one embodiment, at least some of the electrical connections can include lead bonds. Such connections can include leads that extend along either or both of the first and second surfaces 21, 22 of the substrate 20 between the conductive elements 24 and the terminals 25. In a particular example, such leads can be electrically connected between the contacts 35 of each microelectronic element 30 and the terminals 25, each lead having a portion aligned with at least one of the apertures 26.

The second package 10 can further include an adhesive 9 between the front surface 31 of the microelectronic elements 30 and the first surface 21 of the substrate 20. The second package 10 can also include an encapsulant 90 that can optionally cover, partially cover, or leave uncovered the rear surfaces 39 of the microelectronic elements 30. For example, in the packages shown in FIGS. 1A-1C, an encapsulant can be flowed, stenciled, screened or dispensed onto the rear surfaces 39 of the microelectronic elements 30. In another example, the encapsulant can be a mold compound which is formed thereon by overmolding.

In variations of the embodiments described above it is possible for the contacts of microelectronic elements to not be disposed in central regions of the surfaces thereof. Rather, the contacts may be disposed in one or more rows adjacent an edge of such microelectronic element. In another variation, the contacts of a microelectronic element can be disposed adjacent two opposed edges of such microelectronic element. In yet another variation, the contacts of a microelectronic element can be disposed adjacent any two edges, or be disposed adjacent more than two edges of such microelectronic element. In such cases, locations of apertures in the substrate can be modified to correspond to such locations of the contacts disposed adjacent such edge or edges of the microelectronic element.

Figure 3C:
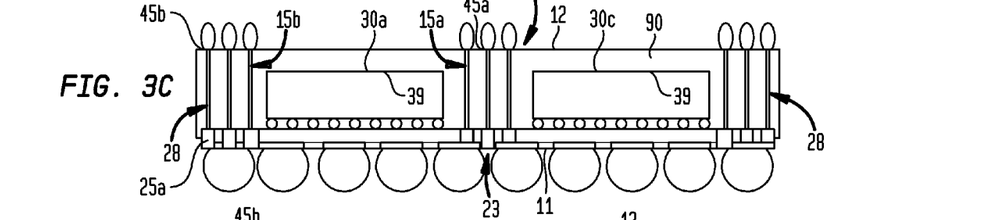
FIG. 3C is a side sectional view of another variation of the second package of FIG. 3A, taken along the line 1-1 of FIG. 3A.
Figure 3D:
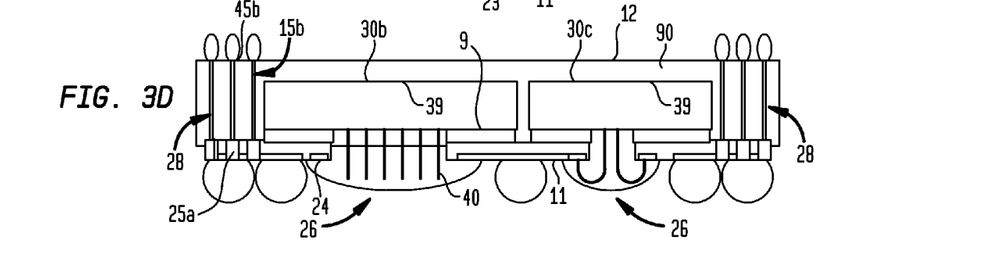
FIG. 3D is a side sectional view of a variation of the second package of FIG. 3A, taken along the line 2-2 of FIG. 3A.

FIG. 3C illustrates a variation of the embodiment described above relative to FIG. 3B, in which the microelectronic elements 30 are flip-chip bonded to the second surface 22 of the substrate 20. In such an embodiment, electrical connections between the microelectronic elements 30 and the substrate 20 include flip-chip connections extending between contacts of each of the microelectronic elements and conductive bond pads at the second surface 22 of the substrate.

FIGS. 4A-4K show additional variations of the second package 10 shown in FIG. 3A having different locations of the microelectronic elements relative to the first surface of the substrate. In FIGS. 4A-4I, the respective microelectronic packages 410a through 410i can each include four microelectronic elements 430, each microelectronic element having contacts that are flip-chip bonded to the substrate or wire-bonded through a respective aperture to conductive contacts at the second surface of the substrate. The inner edges of the microelectronic elements can define portions of the boundary of a central region 423 of the substrate.

Figure 4A:
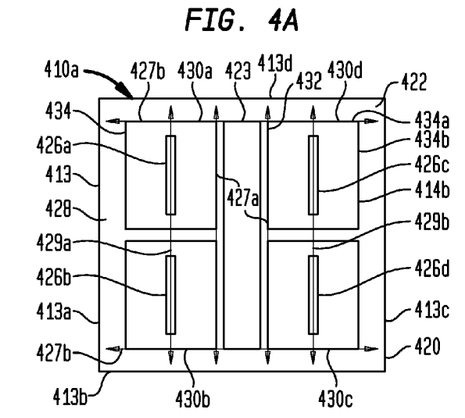
FIGS. 4A-4I are top views of microelectronic packages having four microelectronic elements according to further embodiments, showing the location of the bond windows and the central region.

Referring to FIG. 4A, the four microelectronic elements 430 can be arranged along two parallel axes 429a and 429b. Similar to the microelectronic elements 30 described above, each of the microelectronic elements 430 can have a plurality of element contacts, at least some of which can be arranged in a column of contacts extending along one of the two parallel axes 429a or 429b. In the example shown in FIG. 4A, the column of contacts of each of the first and second microelectronic elements 430a and 430b can extend along a first axis 429a, and the column of contacts of each of the third and fourth microelectronic elements 430c and 430d can extend along a second axis 429b.

In one example, the substrate 420 can have four apertures 426a, 426b, 426c, and 426d extending therethrough. The first axis 429a can extend in a direction of the length of the apertures 426a and 426b, and the second axis 429b can extend in a direction of the length of the apertures 426c and 426d. In such an example, element contacts of each of the microelectronic elements 430 can be connected with contacts of the substrate 420 by leads (e.g., wire bonds) aligned with a respective one of the apertures 426, similar to the embodiment shown in FIG. 3B. Alternatively, the microelectronic elements 430 can be flip-chip bonded to the second surface 422 of the substrate 420, similar to the embodiment shown in FIG. 3C. In each of the embodiments shown in FIGS. 4A-4L, the microelectronic elements 430 can be either connected to substrate contacts with leads aligned with apertures extending through the substrate, or the microelectronic elements can be flip-chip bonded to the second surface of the substrate.

Similar to the second package 10, at least portions of spaced apart inner edges 432 of respective ones of the microelectronic elements 430 can define a central region 423 of the substrate 420 that does not overlie any of the element faces of the microelectronic elements. In one example, the central region 423 can have an outer boundary defined by axes 427a extending along the inner edge 432 of the respective microelectronic elements 430 and by axes 427b extending along the outer edges 434 that of the microelectronic elements that are adjacent to the inner edges. In the example shown in FIG. 4A, the axes 427b extend along the shorter outer edges 434a of the microelectronic elements 430, but that need not be the case.

The substrate 420 can also have a peripheral region 428 that does not overlie any of the element faces of the microelectronic elements 430. The peripheral region 428 can be bounded by the outer edges 434a and 434b of each of the microelectronic elements and can be bounded by the outer edges 413a, 413b, 413c, 413d of the substrate 420.

Figure 4B:
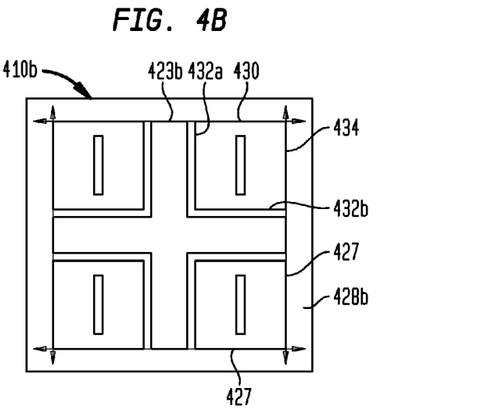

Referring to FIG. 4B, the microelectronic package 410b is the same as the microelectronic package 410a, except the microelectronic elements 430 are all spaced apart from one another, such that the central region 423b has an irregular shape. The central region 423b can have an outer boundary defined by adjacent inner edges 432a and 432b of each of the microelectronic elements 430 and defined by axes 427 extending along the outer edges 434 of each of the microelectronic elements.

Figure 4C:
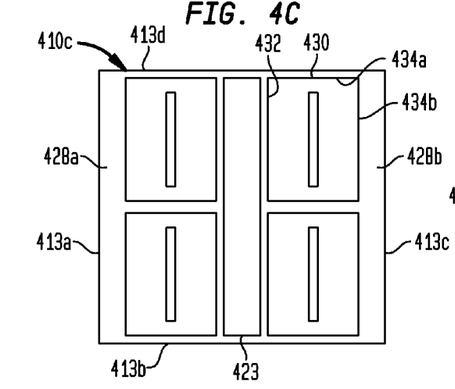

Referring to FIG. 4C, the microelectronic package 410c is the same as the microelectronic package 410a, except the microelectronic elements 430 each have first outer edges 434a adjacent one of the outer edges 413b, 413d of the substrate 420, such that there are two spaced apart peripheral regions 428a and 428b defined between outer edges 413a and 413c of the substrate and second outer edges 434b of the microelectronic elements.

Figure 4D:
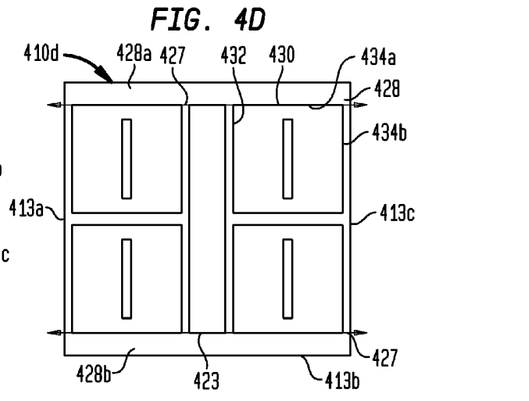

Referring to FIG. 4D, the microelectronic package 410d is the same as the microelectronic package 410c, except the microelectronic elements 430 each have the second outer edges 434b adjacent one of the outer edges 413a, 413c of the substrate 420, such that there are two spaced apart peripheral regions 428a and 428b defined between outer edges 413b and 413d of the substrate and axes 427 extending along the first outer edges 434a of the microelectronic elements.

Figure 4E:
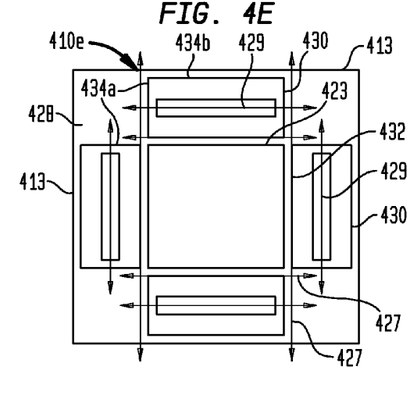

Referring to FIG. 4E, the microelectronic package 410e is the same as the second package 10 shown in FIG. 3A, except that an axis 429 bisecting each microelectronic element 430 does not intersect the area of any of the other microelectronic elements in the microelectronic package 410e, and an axis 427 extending along an inner edge 432 of each microelectric element does not intersect the area of any of the other microelectronic elements in the microelectronic package. As can be seen in FIG. 4E, similar to FIG. 3A, the central region 423 can have a closed outer boundary defined by the axes 427 extending along the inner edges 432 of the respective microelectronic elements 430. The microelectronic elements 430 can each have first outer edges 434a transverse to the outer edges 413 of the substrate 420 and second outer edges 434b adjacent the outer edges of the substrate, such that there are four spaced apart peripheral regions 428 each defined between the outer edges of the substrate and the first outer edges of adjacent microelectronic elements.

Figure 4F:
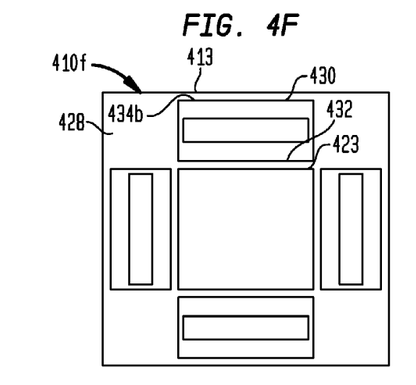

Referring to FIG. 4F, the microelectronic package 410f is the same as the second package 410e shown in FIG. 4E, except that the second outer edge 434b of each of the microelectronic elements 430 is spaced apart from the respective nearest outer edge 413 of the substrate, such that a portion of the peripheral region 428 extends between the outer edges of the substrate and the second outer edges of each of the microelectronic elements.

Figure 4G:
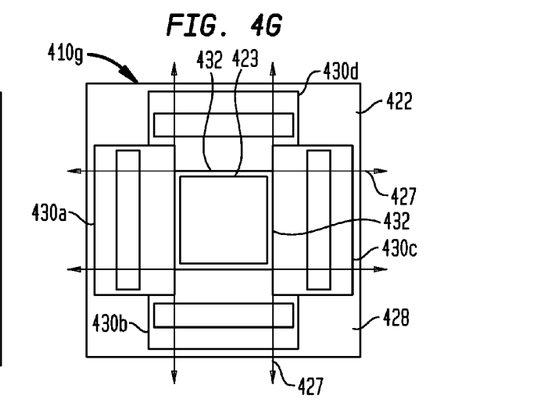

Referring to FIG. 4G, the microelectronic package 410g is the same as the second package 410e shown in FIG. 4E, except that an axis 427 extending along an inner edge 432 of each microelectronic element 430 intersects the area of two of the other microelectronic elements in the microelectronic package. Also, two of the microelectronic elements 430b and 430d can be disposed adjacent the second surface 422 of the substrate 420 in a single plane, and two of the microelectronic elements 430a and 430c can each at least partially overlie the other two microelectronic elements 430b and 430d.

Figure 4H:
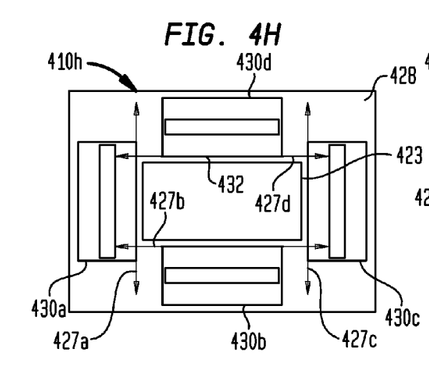

Referring to FIG. 4H, the microelectronic package 410h is the same as the second package 410e shown in FIG. 4E, except that axes 427a and 427c extending along an inner edge 432 of the respective microelectronic elements 430a and 430c does not intersect the area of any of the other microelectronic elements in the microelectronic package, while axes 427b and 427d extending along an inner edge 432 of the respective microelectronic elements 430b and 430d intersect the area of two of the other microelectronic elements 430a and 430c in the microelectronic package.

Figure 4I:
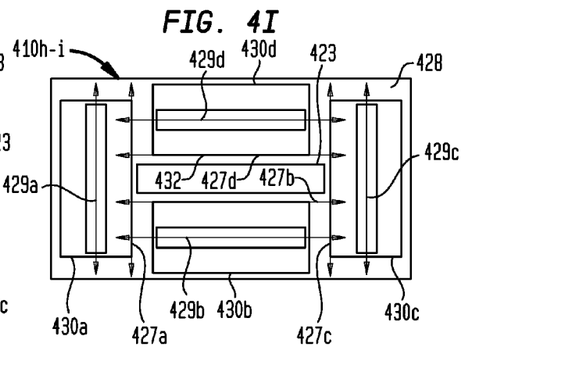
Figure 4J:
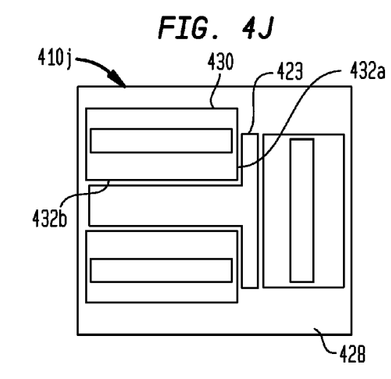
FIGS. 4J and 4K are top views of microelectronic packages having three microelectronic elements according to further embodiments, showing the location of the bond windows and the central region.
Figure 4K:
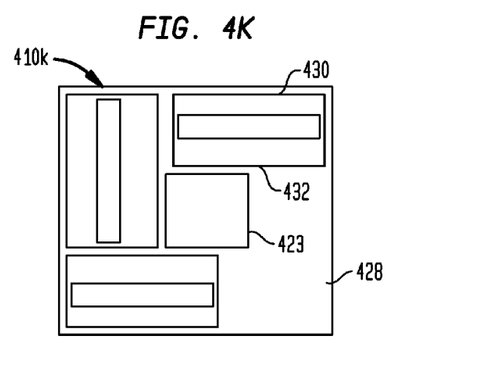
Figure 4L:
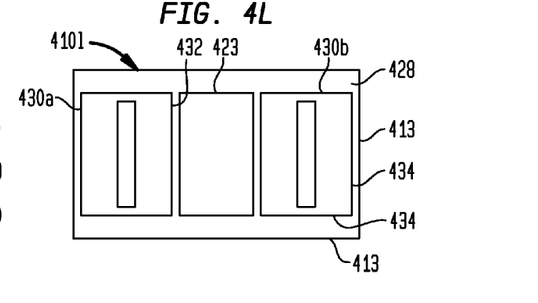
FIG. 4L is a top view of a microelectronic package having two microelectronic elements according to another embodiment, showing the location of the bond windows and the central region.

Referring to FIG. 4I, the microelectronic package 410i is the same as the second package 410h shown in FIG. 4H, except that axes 429a and 429c bisecting the respective microelectronic elements 430a and 430c does not intersect the area of any of the other microelectronic elements in the microelectronic package, while axes 429b and 429d extending along an inner edge 432 of the respective microelectronic elements 430b and 430d intersect the area of two of the other microelectronic elements 430a and 430c in the microelectronic package.

FIGS. 4J and 4K show additional variations of the second package 10 shown in FIG. 3A having three microelectronic elements having front surfaces arranged in a single plane parallel to the first surface of the substrate. In FIG. 4J, the microelectronic package 410j has three microelectronic elements 430 mounted to the second side of the substrate. In FIG. 4K, the microelectronic package 410k is the same as the microelectronic package 10 shown in FIG. 3A, except that one of the microelectronic elements 430 in the pinwheel configuration is omitted, leaving three microelectronic elements having front surfaces arranged in a single plane parallel to the first surface of the substrate.

FIG. 4L shows an additional variation of the second package 10 shown in FIG. 3A having two microelectronic elements 430 having front surfaces arranged in a single plane parallel to the first surface of the substrate. A central region 423 can be defined between spaced-apart inner edges 432 of the opposed microelectronic elements 430a and 430b. A peripheral region 428 can extend outside the central region 423 between the outer edges 413 of the substrate 420 and the outer edges 434 of the microelectronic elements 430.

Figure 5A:
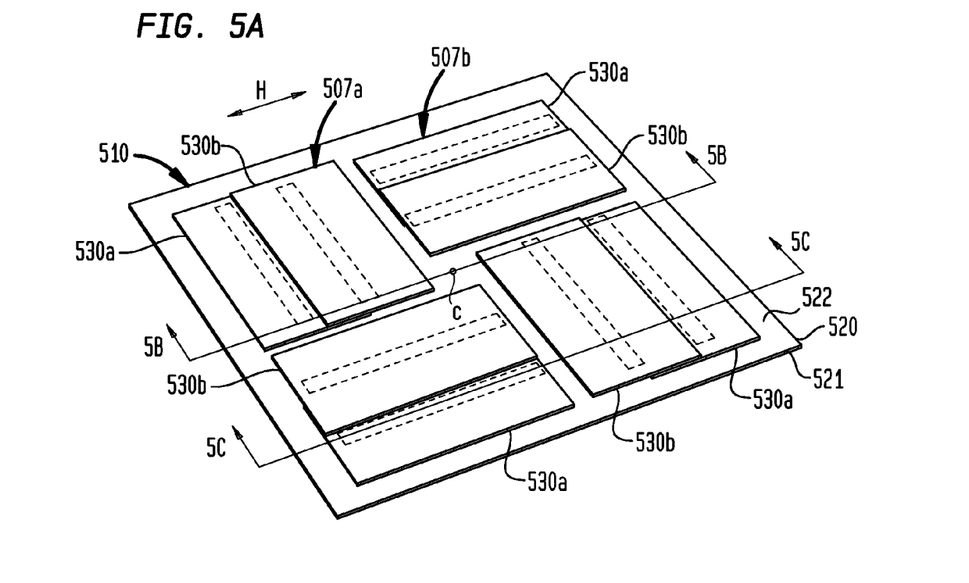
FIG. 5A is a diagrammatic perspective view of a microelectronic package according to yet another embodiment having stacked microelectronic elements.
Figure 5B:
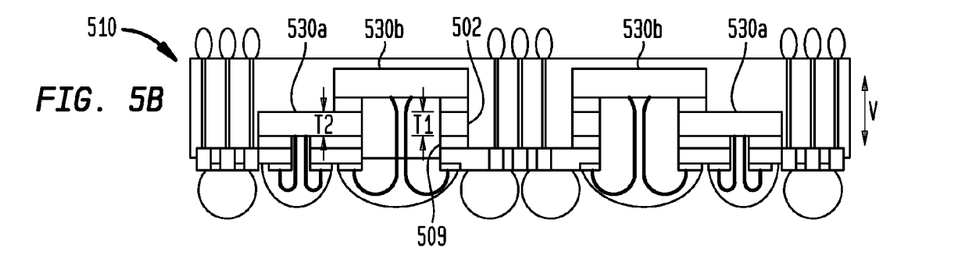
FIG. 5B is a side sectional view of the microelectronic package of FIG. 5A, taken along the line 5B-5B of FIG. 5A.
Figure 5C:
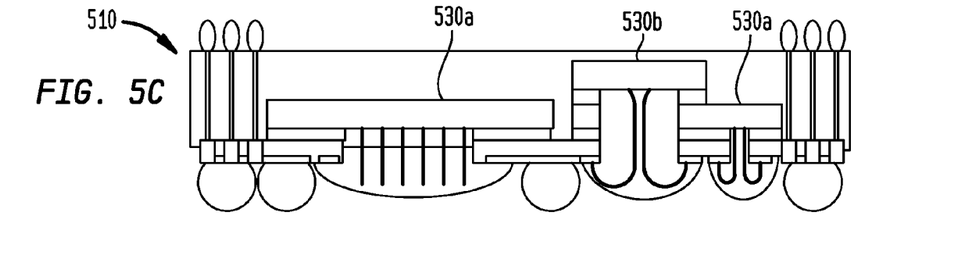
FIG. 5C is a side sectional view of the microelectronic package of FIG. 5A, taken along the line 5C-5C of FIG. 5A.

FIGS. 5A-5C illustrate a variation of the embodiment described above relative to FIG. 3A. The second package 510 is similar to the microelectronic package 10 shown in FIG.

3A, except that in the microelectronic package 510, the front surface 531 of an upper microelectronic element 530b at least partially overlies a rear surface 539 of each of the four lower microelectronic elements 530a. The lower microelectronic elements 530a and the upper microelectronic elements 530b can be arranged in pairs 507 of microelectronic elements. Adjacent pairs 507 of microelectronic elements, such as a first pair 507a and a second pair 507b can be fully spaced apart from one another in a horizontal direction H parallel to the second surface 522 of the substrate 520. In a particular example, the microelectronic elements 530a and 530b can together embody a greater number of active devices to provide memory storage array function than any other function.

In one embodiment, the microelectronic package 510 can have eight microelectronic elements 530 (including four lower microelectronic elements 530a and four upper microelectronic elements 530b), each microelectronic element including eight data I/O contacts. In another embodiment, the microelectronic package 510 can have eight microelectronic elements 530 (including four lower microelectronic elements 530a and four upper microelectronic elements 530b), each microelectronic element including nine data I/O contacts.

In a particular example, at least some of the electrically conductive contacts 535 at the front surface 531 of the lower microelectronic element 530a of adjacent pairs of microelectronic elements can be arranged in respective columns of contacts defining first and second axes 529a and 529a'. As shown in FIG. 5A, such first and second axes 529a and 529a' can be transverse to one another. In a particular example, the first and second axes 529a and 529a' can be orthogonal to one another. In one embodiment, the first and second axes 529a and 529a' can be parallel to one another.

In one embodiment, each pair of microelectronic elements 507 can at least partially overlie an outer aperture 526a extending between the first and second surfaces 521, 522 of the substrate 520. Each outer aperture 526a can have a length defining an outer axis 509a. The four outer axes 509a can be arranged in a pinwheel configuration as described above, wherein the outer axes 509a can be arranged in two parallel pairs of outer axes, each pair being transverse to the other pair. A central region 523 occupying a central portion of the second surface 522 of the substrate 520 can be bounded by the four outer axes 509a, as shown in FIG. 5C. At least some of the terminals 525 in the central region 523 of the second surface 522 of the substrate 520 can be first terminals having a function similar to the first terminals 25a described above.

In an exemplary embodiment, each pair of microelectronic elements 507 can also at least partially overlie an inner aperture 526b extending between the first and second surfaces 521, 522 of the substrate 520 adjacent a corresponding one of the outer apertures 526a in the same pair of microelectronic elements, as shown in FIG. 5A. Each inner aperture 526b can have a length defining an axis 509b that is closer to a centroid C of the substrate than the axis 509a defined by the length of the corresponding one of the outer apertures 526a.

As shown in FIG. 5A, each lower microelectronic element 530a overlies an outer aperture 526a, and each upper microelectronic element 530b overlies an inner aperture 526b. In a particular embodiment, each upper microelectronic element 530b can overlie an outer aperture 526a, and each lower microelectronic element 530a can overlie an inner aperture 526b. In one example, one or more of the lower microelectronic elements 530a can overlie corresponding outer apertures 526a, and the other lower microelectronic elements can overlie corresponding inner apertures 526b, while one or more of the upper microelectronic elements 530b can overlie corresponding outer apertures, and the other upper microelectronic elements can overlie corresponding inner apertures.

A spacer 502 can be positioned between the front surface 531 of the upper microelectronic elements 530b and a portion of the first surface 521 of the substrate 520, with or without an adhesive 509 located between the spacer and the first surface of the substrate. Such a spacer 502 can be made, for example, from a dielectric material such as silicon dioxide, a semiconductor material such as silicon, or one or more layers of adhesive. If the spacer 502 includes adhesives, the adhesives can connect the upper microelectronic elements 530b to the substrate 520. In one embodiment, the spacer 502 can have substantially the same thickness T1 in a vertical direction V substantially perpendicular to the first surface 521 of the substrate 520 as the thickness T2 of the lower microelectronic elements 530a between the front and rear surfaces 531, 532 thereof. In a particular embodiment, for example, when the spacer 502 is made of an adhesive material, the spacer 502 can be used without an adhesive 502 such as the adhesive 9 described above.

Figure 6:
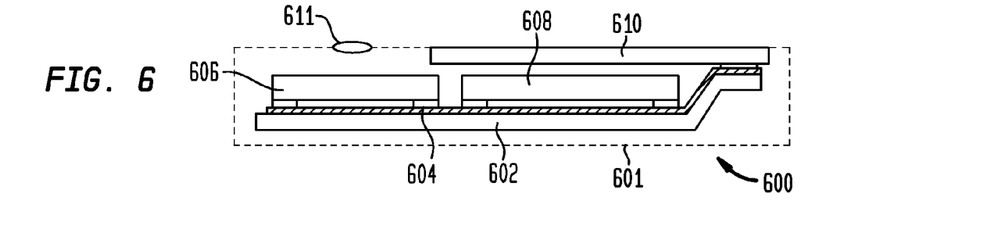
FIG. 6 is a schematic depiction of a system according to one embodiment of the invention.

The microelectronic packages and microelectronic assemblies described above with reference to FIGS. 1A through 5C can be utilized in construction of diverse electronic systems, such as the system 600 shown in FIG. 6. For example, the system 600 in accordance with a further embodiment of the invention includes a plurality of modules or components 606 such as the microelectronic packages and/or microelectronic assemblies as described above in conjunction with other electronic components 608 and 610.

In the exemplary system 600 shown, the system can include a circuit panel, motherboard, or riser panel 602 such as a flexible printed circuit board, and the circuit panel can include numerous conductors 604, of which only one is depicted in FIG. 6, interconnecting the modules or components 606 with one another. Such a circuit panel 602 can transport signals to and from each of the microelectronic packages and/or microelectronic assemblies included in the system 600. However, this is merely exemplary; any suitable structure for making electrical connections between the modules or components 606 can be used.

In a particular embodiment, the system 600 can also include a processor such as the semiconductor chip 608, such that each module or component 606 can be configured to transfer a number N of data bits in parallel in a clock cycle, and the processor can be configured to transfer a number M of data bits in parallel in a clock cycle, M being greater than or equal to N.

In the example depicted in FIG. 6, the component 608 is a semiconductor chip and component 610 is a display screen, but any other components can be used in the system 600. Of course, although only two additional components 608 and 610 are depicted in FIG. 6 for clarity of illustration, the system 600 can include any number of such components.

Modules or components 606 and components 608 and 610 can be mounted in a common housing 601, schematically depicted in broken lines, and can be electrically interconnected with one another as necessary to form the desired circuit. The housing 601 is depicted as a portable housing of the type usable, for example, in a cellular telephone or personal digital assistant, and screen 610 can be exposed at the surface of the housing. In embodiments where a structure 606 includes a light-sensitive element such as an imaging chip, a lens 611 or other optical device also can be provided for routing light to the structure. Again, the simplified system shown in FIG. 6 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
    a first package comprising a microelectronic element embodying a processor, the first package having processor package terminals at a face thereof; and
    a second package electrically connected to the first package, the second package comprising:
        two or more microelectronic elements each having memory storage array function, each having an element face and a plurality of contacts at the respective element face;
        upper and lower opposite package faces each parallel to the element faces, the upper package face defined by a surface of a dielectric layer overlying the element faces of the two or more microelectronic elements, wherein at least portions of inner edges of respective microelectronic elements of the two or more microelectronic elements are spaced apart from one another, so as to define a central region between the inner edges that does not overlie any of the element faces of the microelectronic elements of the second package;
        upper terminals at the upper package face, the upper terminals joined to the processor package terminals and electrically connected with at least some of the contacts; and
        lower terminals at the lower package face and configured for electrically connecting the assembly with a component external thereto; and
        electrically conductive structure aligned with the central region and extending through the second package to electrically connect the lower terminals with at least one of: the upper terminals or the contacts,
        wherein the two or more microelectronic elements comprise first, second, third, and fourth microelectronic elements, and
        wherein the microelectronic elements have first, second, third, and fourth axes extending along the inner edge of the respective first, second, third, and fourth microelectronic elements, the axes together defining a closed outer boundary of the central region, the first and third axes being parallel to one another, and the second and fourth axes being transverse to the first and third axes.

2. The microelectronic assembly as claimed in claim 1, further comprising peripheral conductive interconnects aligned with a peripheral region defined between the central region and outer edges of the second package and not overlying any of the element faces of the microelectronic elements of the second package, the peripheral conductive interconnects connecting the lower terminals with at least one of: the upper terminals or the contacts.

3. The microelectronic assembly as claimed in claim 2, wherein at least a portion of the electrically conductive structure aligned with the central region is configured to carry at least one of power or ground to the upper terminals.

4. The microelectronic assembly as claimed in claim 2, wherein at least a portion of the electrically conductive structure aligned with the central region is configured to carry at least one of power or ground to the contacts of the microelectronic elements of the second package.

5. The microelectronic assembly as claimed in claim 3, wherein at least some of the peripheral conductive interconnects are configured to carry data signals to the upper terminals.

6. The microelectronic assembly as claimed in claim 2, wherein the upper terminals and the lower terminals each include central terminals at the central region and peripheral terminals at the peripheral region, and wherein the upper terminals include intermediate terminals overlying the element face of at least one of the microelectronic elements of the second package.

7. The microelectronic assembly as claimed in claim 1, wherein at least some of the upper terminals overlie the element face of at least one of the microelectronic elements of the second package.

8. The microelectronic assembly as claimed in claim 7, wherein the at least some of the upper terminals are electrically connected to the contacts of at least one of the microelectronic elements of the second package, and the processor package terminals connected to the at least some of the upper terminals are electrically connected to contacts of the microelectronic element of the first package.

9. The microelectronic assembly as claimed in claim 7, wherein the at least some of the upper terminals are configured to carry at least one of: data signals or address information usable by circuitry within the second package to determine an addressable memory location from among all the available addressable memory locations of a memory storage array of at least one of the microelectronic elements of the second package.

10. The microelectronic assembly as claimed in claim 1, wherein at least some of the upper and lower terminals are electrically connected within the second package to the contacts of the microelectronic elements of the second package.

11. The microelectronic assembly as claimed in claim 1, wherein the microelectronic element of the first package is electrically connected to a first one of the microelectronic elements of the second package, and the first one of the microelectronic elements of the second package is electrically connected to a second one of the microelectronic elements of the second package.

12. The microelectronic assembly as claimed in claim 1, wherein a first portion of the electrically conductive structure aligned with the central region is electrically connected within the second package to the contacts of the microelectronic elements of the second package, and a second portion of the electrically conductive structure aligned with the central region is electrically insulated within the second package from the microelectronic elements of the second package.

13. The microelectronic assembly as claimed in claim 2, wherein at least a portion of the electrically conductive structure aligned with the central region is electrically insulated within the second package from the microelectronic elements of the second package.

14. The microelectronic assembly as claimed in claim 2, wherein at least some of the peripheral conductive interconnects are electrically insulated within the second package from the microelectronic elements of the second package.

15. The microelectronic assembly as claimed in claim 1, further comprising a heat spreader in thermal communication with the microelectronic element of the first package.

16. The microelectronic assembly as claimed in claim 1, wherein the first package includes at least one passive element electrically connected to the microelectronic element of the first package, the at least one passive element disposed adjacent a peripheral edge of the microelectronic element of the first package.

17. The microelectronic assembly as claimed in claim 16, wherein the at least one passive element includes at least one decoupling capacitor.

18. The microelectronic assembly as claimed in claim 1, wherein the second package includes a substrate, and the surface of the dielectric layer that defines the upper package face of the second package is a first surface of the substrate.

19. The microelectronic assembly as claimed in claim 1, wherein the dielectric layer is formed on surfaces of the microelectronic elements, and wherein the second package includes traces formed on the dielectric layer and connected with the upper and lower terminals.

20. The microelectronic assembly as claimed in claim 18, wherein the contacts of one or more of the microelectronic elements face and are electrically connected to substrate contacts at a second surface of the substrate opposite from the first surface thereof.

21. The microelectronic assembly as claimed in claim 18, wherein the substrate has at least one aperture extending through a thickness thereof, and wherein the contacts of one or more of the microelectronic elements are aligned with the at least one aperture and electrically connected with substrate contacts at the first surface of the substrate by a plurality of leads.

22. The microelectronic assembly as claimed in claim 21, wherein at least some of the leads include wire bonds extending through the at least one aperture.

23. A microelectronic assembly, comprising:
  a first package comprising a microelectronic element embodying a processor, the first package having processor package terminals at a face thereof; and
  a second package electrically connected to the first package, the second package comprising:
    two or more microelectronic elements each having memory storage array function, each having an element face and a plurality of contacts at the respective element face;
    upper and lower opposite package faces each parallel to the element faces, the upper package face defined by a surface of a dielectric layer overlying the element faces of the two or more microelectronic elements, wherein at least portions of inner edges of respective microelectronic elements of the two or more microelectronic elements are spaced apart from one another, so as to define a central region between the inner edges that does not overlie any of the element faces of the microelectronic elements of the second package;
    upper terminals at the upper package face, the upper terminals joined to the processor package terminals and electrically connected with at least some of the contacts; and
    lower terminals at the lower package face and configured for electrically connecting the assembly with a component external thereto; and
    electrically conductive structure aligned with the central region and extending through the second package to electrically connect the lower terminals with at least one of: the upper terminals or the contacts,
  wherein the second package is joined with the component, the component comprising a circuit panel having a panel face and a plurality of panel contacts at the panel face, and wherein at least some of the lower terminals are joined to the panel contacts, and
  wherein the two or more microelectronic elements comprise first, second, third, and fourth microelectronic elements, and wherein the microelectronic elements have first, second, third, and fourth axes extending along the inner edge of the respective first, second, third, and fourth microelectronic elements, the axes together defining a closed outer boundary of the central region.

24. The microelectronic assembly as claimed in claim 23, wherein the first and third axes are parallel to one another, and the second and fourth axes are transverse to the first and third axes.

25. The microelectronic assembly as claimed in claim 24, wherein the second and fourth axes are orthogonal to the first and third axes.

26. The microelectronic assembly as claimed in claim 23, wherein the two or more microelectronic elements comprise first, second, third, and fourth microelectronic elements, and wherein the contacts of each of the microelectronic elements are arranged along respective first, second, third, and fourth parallel axes.

27. The microelectronic assembly as claimed in claim 23, wherein the panel contacts are electrically connected with the microelectronic element of the first package through the electrically conductive structure aligned with the central region of the second package.

28. The microelectronic assembly as claimed in claim 27, further comprising peripheral conductive interconnects aligned with a peripheral region defined between the central region and outer edges of the second package and not overlying any of the element faces of the microelectronic elements of the second package, the peripheral conductive interconnects connecting the lower terminals with at least one of: the upper terminals or the contacts, wherein the panel contacts are electrically connected with the processor package terminals through at least a portion of the electrically conductive structure aligned with the central region and at least some of the peripheral conductive interconnects.

29. A system comprising a microelectronic assembly according to claim 23 and one or more other electronic components electrically connected to the microelectronic assembly.

* * * * *